United States Patent
Kousaki

(10) Patent No.: US 8,250,510 B2
(45) Date of Patent: Aug. 21, 2012

(54) JITTER AMOUNT ESTIMATING METHOD, METHOD FOR CALCULATING CORRELATION BETWEEN AMOUNT OF SIMULTANEOUSLY OPERATING SIGNAL NOISE AND JITTER AMOUNT, AND RECORDING MEDIUM

(75) Inventor: Yasuo Kousaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 497 days.

(21) Appl. No.: 12/201,732

(22) Filed: Aug. 29, 2008

(65) Prior Publication Data

US 2009/0172609 A1 Jul. 2, 2009

(30) Foreign Application Priority Data

Dec. 28, 2007 (JP) ................................. 2007-341436

(51) Int. Cl.
*G06F 17/50* (2006.01)
(52) U.S. Cl. ........................................ 716/117; 716/137
(58) Field of Classification Search .................. 716/117, 716/137
See application file for complete search history.

(56) References Cited

U.S. PATENT DOCUMENTS

| 5,854,575 A * | 12/1998 | Fiedler et al. ................... 331/10 |
| 6,054,903 A * | 4/2000 | Fiedler ............................. 331/17 |
| 6,377,646 B1 * | 4/2002 | Sha ................................ 375/376 |
| 6,460,001 B1 | 10/2002 | Yamaguchi et al. |

FOREIGN PATENT DOCUMENTS

| JP | 7-73219 A | 3/1995 |
| JP | 10-127089 | 5/1998 |
| JP | 2004-205095 | 7/2004 |
| JP | 2005-38400 A | 2/2005 |
| JP | 2006-31510 A | 2/2006 |
| JP | 2008-59553 A | 3/2008 |
| JP | 2009-140265 A | 6/2009 |
| WO | 01/73455 A1 | 10/2001 |

* cited by examiner

*Primary Examiner* — Jack Chiang
*Assistant Examiner* — Brandon Bowers
(74) *Attorney, Agent, or Firm* — Fujitsu Patent Center

(57) ABSTRACT

An SSO noise calculating unit estimates the amount of simultaneously operating signal noise caused by simultaneous operations of input/output pins peripheral to a power supply voltage pin as a center. A PLL jitter calculating unit estimates the amount of jitter occurring at the power supply voltage pin by using as an input the estimated amount of simultaneously operating signal noise, and by referencing a correlation between the amount of simultaneously operating signal noise and the amount of jitter, which indicates a correlation calculated beforehand between the amount of simultaneously operating signal noise and the amount of jitter.

12 Claims, 15 Drawing Sheets

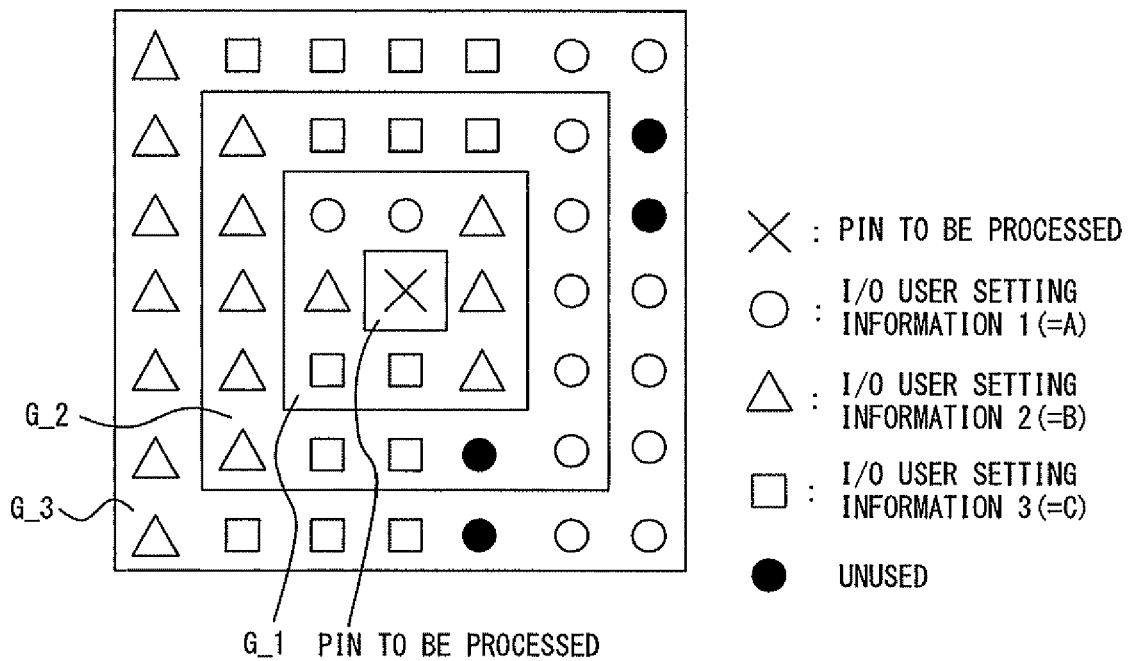
F I G. 3

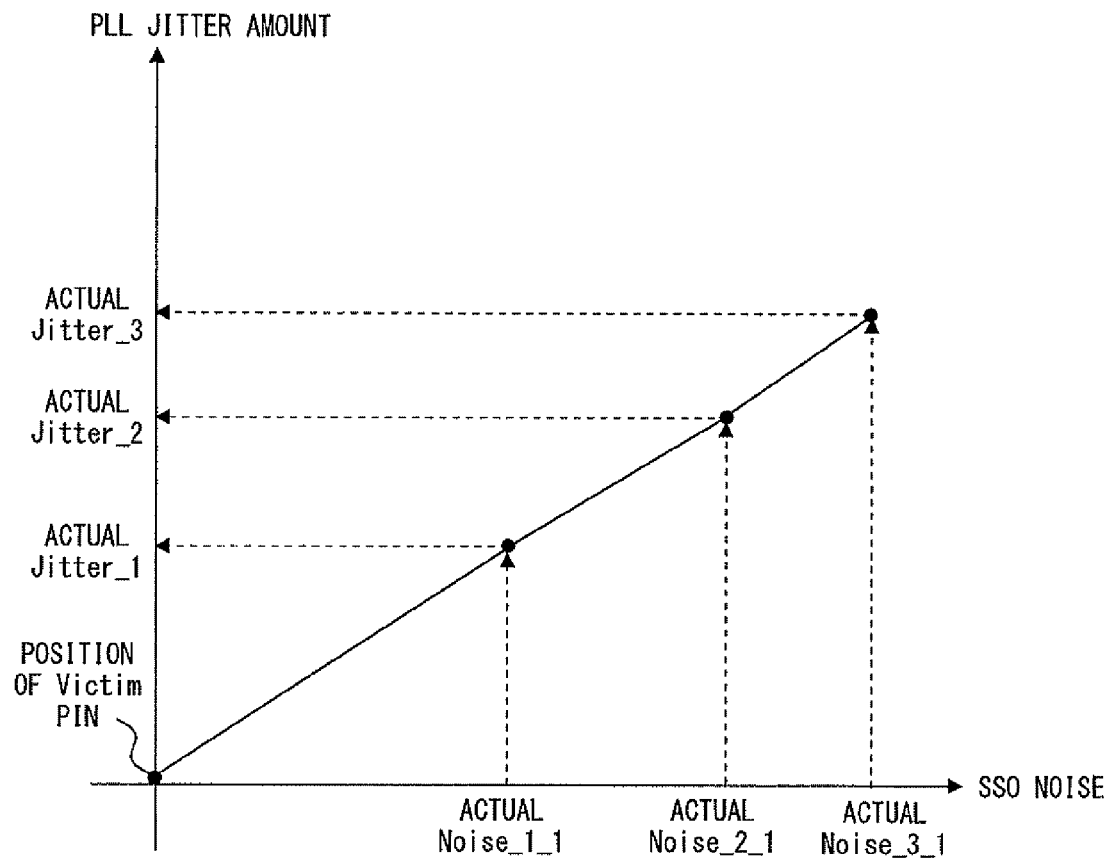
F I G. 7

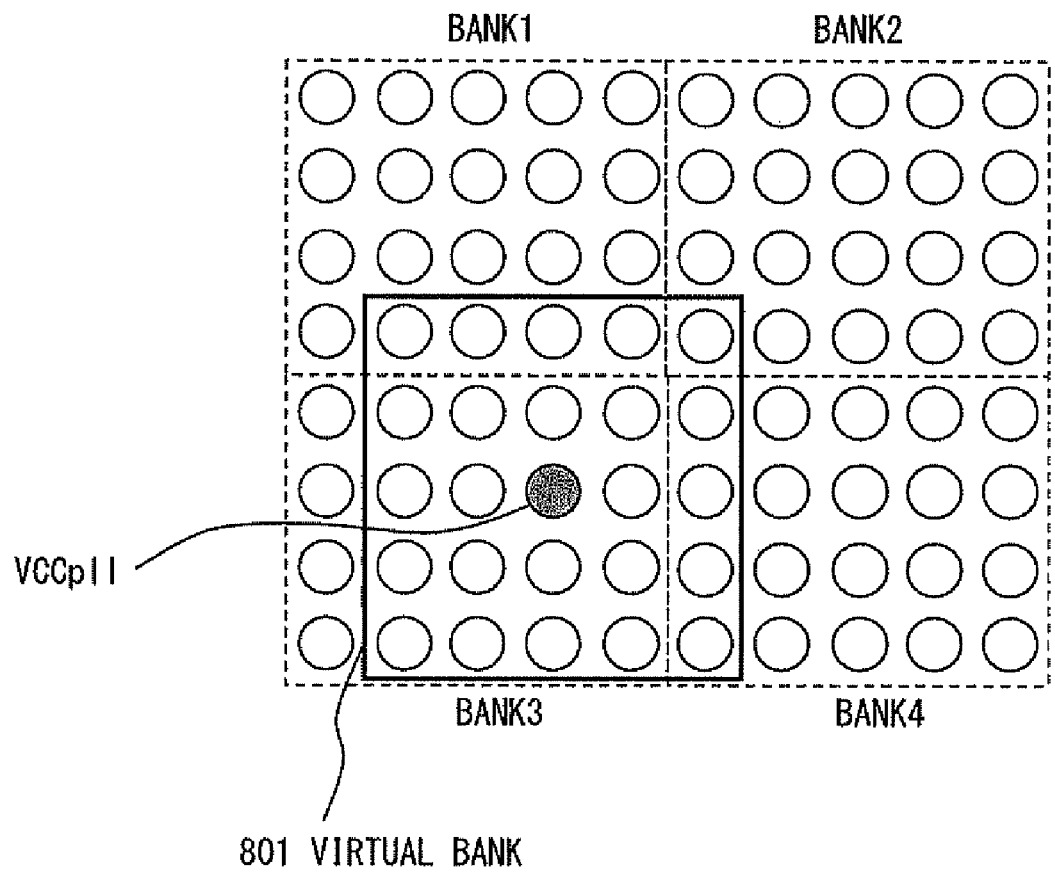
F I G. 8

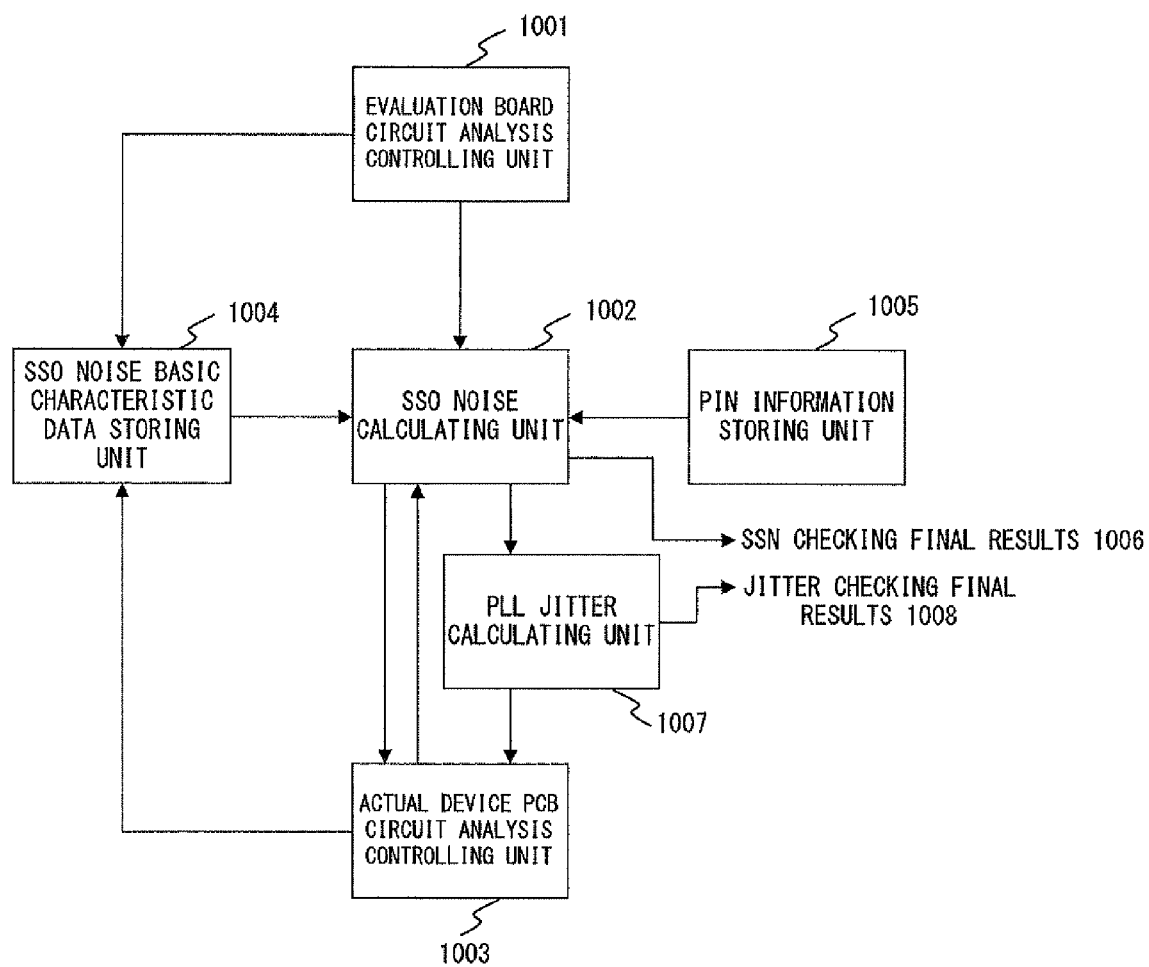
F I G. 10

| LSI IDENTIFIER | PIN IDENTIFIER | ROW | COLUMN | I/O USER SETTING INFORMATION | |
|---|---|---|---|---|---|
| ⋮ | ⋮ | 1 | 1 | A | |
| | | 1 | 2 | B | |
| | | ⋮ | ⋮ | ⋮ | |

FIG. 11

| I/O USER SETTING INFORMATION | NUMBER OF SSOs | SSO NOISE AMOUNT (mV) | SUFFIX (REFERENCE) |
|---|---|---|---|
| A (GND SIDE OF SET VALUE A) | 0 | 50 | |
| | 8 | 380 | ACTUAL Noise_1_1 |
| | 24 | 990 | ACTUAL Noise_2_1 |
| | 48 | 1455 | ACTUAL Noise_3_1 |
| A (VCC SIDE OF SET VALUE A) | 0 | 55 | ACTUAL Noise_1_1' |
| | 8 | 403 | ACTUAL Noise_2_1' |
| | 24 | 1012 | ACTUAL Noise_3_1' |
| | 48 | 1582 | |
| B (GND SIDE OF SET VALUE B) | 0 | 40 | |
| | 8 | 305 | ACTUAL Noise_1_2 |
| | 24 | 786 | ACTUAL Noise_2_2 |
| | 48 | 1245 | ACTUAL Noise_3_2 |
| B (VCC SIDE OF SET VALUE B) | 0 | 44 | |
| | 8 | 368 | ACTUAL Noise_1_2' |
| | 24 | 951 | ACTUAL Noise_2_2' |
| | 48 | 1403 | ACTUAL Noise_3_2' |
| C (GND SIDE OF SET VALUE C) | 0 | 30 | |
| | 8 | 214 | ACTUAL Noise_1_3 |
| | 24 | 524 | ACTUAL Noise_2_3 |
| | 48 | 853 | ACTUAL Noise_3_3 |
| C (VCC SIDE OF SET VALUE C) | 0 | 33 | |
| | 8 | 234 | ACTUAL Noise_1_3' |
| | 24 | 607 | ACTUAL Noise_2_3' |
| | 48 | 911 | ACTUAL Noise_3_3' |
| ... | | | |
| X (GND SIDE OF SET VALUE X) | 0 | 5 | |
| | 8 | 29 | |
| | 24 | 68 | |
| | 48 | 112 | |
| X (VCC SIDE OF SET VALUE X) | 0 | 5.5 | |
| | 8 | 31 | |
| | 24 | 83 | |
| | 48 | 142 | |

FIG. 12

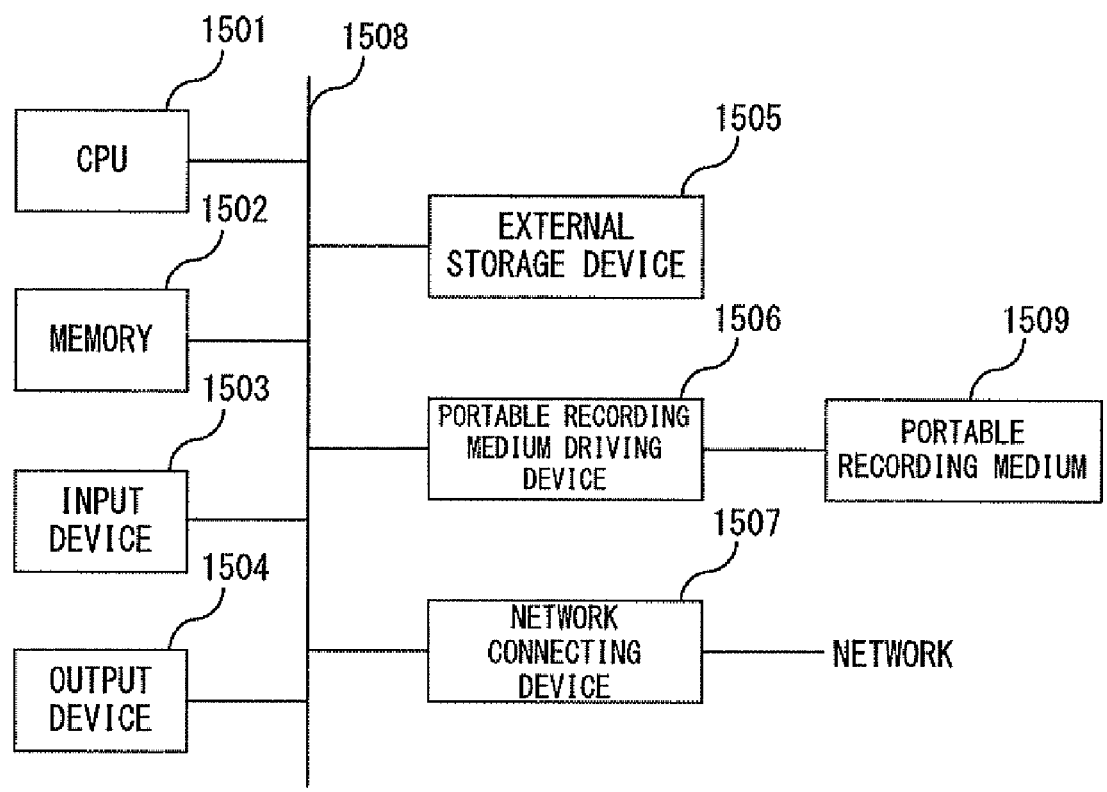
F I G. 15

JITTER AMOUNT ESTIMATING METHOD, METHOD FOR CALCULATING CORRELATION BETWEEN AMOUNT OF SIMULTANEOUSLY OPERATING SIGNAL NOISE AND JITTER AMOUNT, AND RECORDING MEDIUM

BACKGROUND OF THE INVENTION

1. Field of the Invention

The present invention relates to a technique for estimating a PLL jitter amount on the basis of a simultaneously operating signal noise caused by the simultaneous operations of input/output signals of a plurality of pins in a semiconductor device.

2. Description of the Related Art

Conventionally, a power supply oscillation that occurs between a ground or a power supply pin of a device package and a ground or a power supply reference level of a die within a device is called a ground bounce or a power supply sag, and is one of main causes of erroneous switching in a high-speed device.

Recently, an FPGA (Field Programmable Gate Array) has attracted attention as a semiconductor device for which a user can freely set the arrangement of pins, a circuit configuration, the standard of I/O signals (LVTTL, LVCMOS, HSTL, etc.), an output current value (12 mA, 8 mA, 4 mA, etc.), a through rate control (FAST or SLOW), and the like. Because the number of I/O pins and the speeds of interface signals on the FPGA have been increasing, a lot of output pins simultaneously operate. As a result, the above described ground bounce or power supply sag becomes conspicuous. These phenomena are generally called a simultaneously operating signal noise (SSN (Simultaneous Switching Noise) or an SSO (Simultaneous Switching Output) noise), or a crosstalk noise.

Additionally, on the FPGA, a PLL (Phase Locked Loop) for controlling the stable oscillation of an internal clock is mounted, and a dedicated or shared PLL power supply terminal is provided. The PLL power supply voltage of the die within the device is fluctuated by the crosstalk noise (SSO noise) of I/O signals to/from the PLL power supply terminal and wires within the package, and a PLL jitter amount therefore increases.

The amounts of occurring SSO noise and PLL jitter fluctuate depending on the arrangement of pins on the FPGA. Therefore, the amounts of occurring SSO noise and PLL jitter must be estimated based on the arrangement of pins on the FPGA in a design phase of a PCB (Printed Circuit Board) mounting the FPGA in order to operate an FPGA device at suitable timing.

General-purpose circuit analysis simulator software called SPICE (Simulation Program with Integrated Circuit Emphasis), which was developed by the integrated circuit group of Electronics Research Laboratory and the EECS department of the University of California, Berkeley, is known as the conventional technology for simulating an SSO noise.

Additionally, Japanese Published Unexamined Patent Applications Nos. H10-127089 and 2004-205095 disclose the relevant conventional technology.

However, the simulator such as SPICE, etc. requires an enormous amount of time to simulate an SSO noise although it can simulate the SSO noise with relatively high accuracy.

Conventionally, neither a pin arrangement nor an operating state is definitely laid down as the standard of PLL jitter on an FPGA, and how a PLL jitter amount fluctuates depending on a change in a pin arrangement or an operating state is not stipulated. Accordingly, there is a problem that a PLL and an FPGA device cannot be properly operated in some cases depending on a pin arrangement or an operating state.

SUMMARY OF THE INVENTION

An object of the present invention is to establish a method for estimating a PLL jitter amount in an arbitrary pin arrangement or operating state in a short time and with high accuracy based on a simultaneously operating signal noise caused by input/output signals input/output to/from a plurality of pins in a semiconductor device such as an FPGA, etc.

A first aspect of the present invention assumes a method for calculating a correlation between a simultaneously operating signal noise amount and a jitter amount, which is intended to estimate a jitter amount of a semiconductor device, or a program executed based on the method.

Initially, a first correlation between the number of simultaneously operating pins among input/output pins peripheral to a power supply voltage pin as a center and the amount of jitter caused by fluctuations in a power supply voltage is calculated for an input/output pin for which predetermined user setting information is set.

Next, a second correlation between the number of simultaneously operating pins among the input/output pins peripheral to the power supply voltage pin as a center and the amount of simultaneously operating signal noise caused by the simultaneously operating input/output pins is calculated for the input/output pin for which the predetermined user setting information is set.

Then, a third correlation between the amount of simultaneously operating signal noise and the jitter amount is calculated based on the first and the second correlations.

A second aspect of the present invention assumes a jitter amount estimating method for estimating a jitter amount of a semiconductor device, or a program executed based on the method.

Initially, the amount of simultaneously operating signal noise caused by simultaneous operations of input/output pins peripheral to a power supply voltage pin as a center is estimated.

Then, the amount of jitter occurring at the power supply voltage pin is estimated by using as an input the estimated amount of simultaneously operating signal noise, and by referencing a correlation between a simultaneously operating signal noise amount and a jitter amount, which indicates a correlation calculated beforehand between the simultaneously operating signal noise and the jitter amount.

A third aspect of the present invention assumes a method for designing a semiconductor device, and a printed circuit board mounting the semiconductor device by using the jitter amount estimating method in the second aspect of the present invention, or a program executed based on the method.

In this aspect, a pin arrangement or signal timing of the semiconductor device, or a layout, a connection between semiconductor devices, or signal timing of a printed circuit board mounting the semiconductor device are designed based on the estimated jitter amount.

In the first to the third aspects of the present invention, the amount of jitter can be implemented as a jitter amount in a phase locked loop (PLL).

With the above described aspects of the present invention, a method for estimating a jitter amount in an arbitrary pin arrangement and operating state can be established, thereby improving the quality of designing a semiconductor device such as an FPGA, etc., and a printed circuit board mounting the semiconductor device.

A correlation between a simultaneously operating signal noise amount and a jitter amount, which can be calculated according to the present invention, does not depend on the user setting information of each semiconductor pin. Therefore, a breakthrough method for enabling a jitter amount to be calculated from the amount of simultaneously operating signal noise caused by simultaneous operations of input/output pins peripheral to a power supply voltage pin as a center can be realized.

BRIEF DESCRIPTION OF THE DRAWINGS

The present invention will be more apparent from the following detailed description in conjunction with the accompanying drawings, in which:

FIG. 3 is a schematic diagram showing an example of the arrangement of pins for respective pieces of I/O user setting information in the neighborhood of a pin to be processed on an FPGA chip;

FIG. 7 is a schematic diagram showing a correlation between an SSO noise amount and a PLL jitter amount;

FIG. 8 is a conceptual schematic showing a virtual bank centering around a PLL power supply terminal:

FIG. 10 is a block diagram showing an SSN/PLL jitter checking unit having a function to estimate an SSO noise amount in the preferred embodiment of the present invention;

FIG. 11 is a schematic diagram showing an example of a data structure of a pin information storing unit;

FIG. 12 is a schematic diagram showing an example of a table structure of an SSO noise basic characteristic data storing unit;

FIG. 15 is a block diagram showing an example of a hardware configuration of a computer that can carry out a device according to the preferred embodiment of the present invention.

DESCRIPTION OF THE PREFERRED EMBODIMENTS

A preferred embodiment for carrying out the present invention is described in detail below with reference to the drawings.

<Basic Principle of the Preferred Embodiment According to the Present Invention>

The basic principle of the preferred embodiment according to the present invention is initially described prior to explanations about a specific configuration and operations of the preferred embodiment according to the present invention.

Initially, a noise superposed on a signal of a pin to be processed when the signals of pins peripheral to the pin to be processed simultaneously operate must be estimated as an SSO noise for each (referred to as a "pin to be processed") of signal input/output pins (I/O pins, which are referred to simply as "pins" hereinafter) comprised by a semiconductor device, when the SSO noise of the semiconductor device such as an FPGA, etc. is evaluated. If the SSO noise amounts of all the pins to be processed fall within a standard, a designed pin arrangement can be determined to be suitable.

To estimate the SSO noise of one pin to be processed, information, which is set by a user (hereinafter referred to as "I/O user setting information"), about the arrangement of pins peripheral to the pin to be processed, and their input/output signals are important elements. Here, the I/O user setting information is information about the standard (such as LVTTL, LVCMOS, HSTL, etc.) of an input/output signal, an output current value (12 mA, 8 mA, 4 mA, etc.), a through rate (FAST or SLOW), and the like.

When the SSO noise of I/O pins on a semiconductor is estimated in the preferred embodiment according to the present invention, a plurality of pins that are positioned in areas in the neighborhood of a pin to be processed are classified into a plurality of groups according to the size of a coupled inductance of a return current to the pin to be processed, specifically, according to a distance to the pin to be processed.

Figure 1:
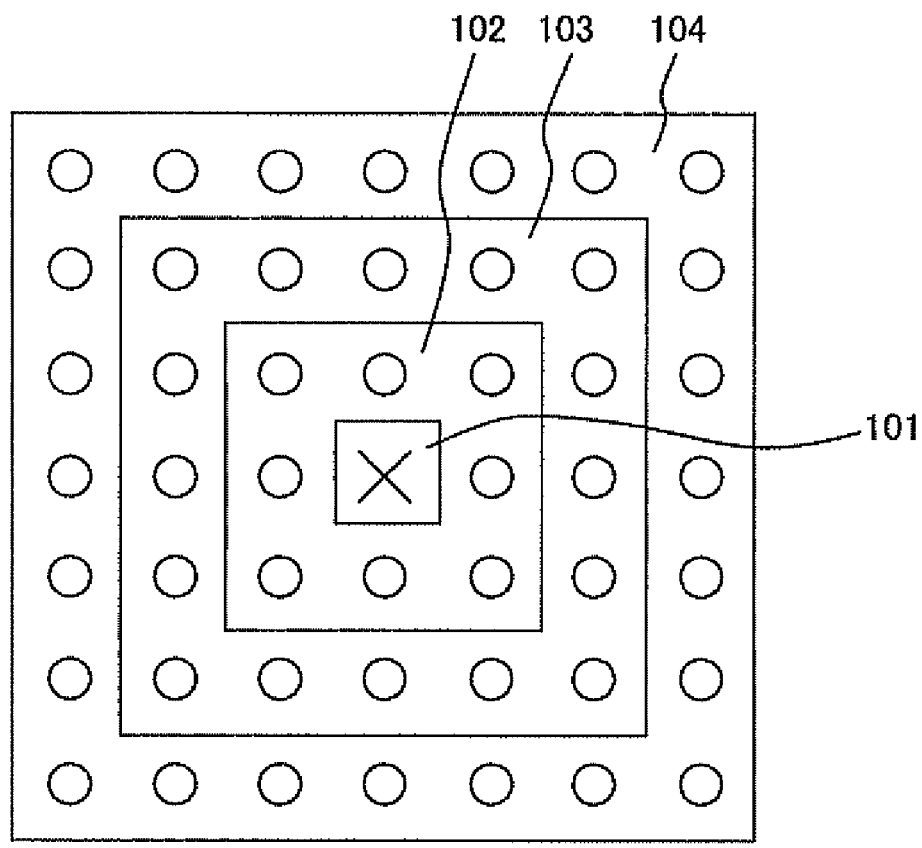
FIG. 1 is a schematic diagram showing an example of classifying into groups pins arranged in the neighborhood of a pin to be processed on an FPGA chip.

The preferred embodiment according to the present invention adopts, for example, the group classification shown in FIG. 1 as the classification of pins into groups in consideration of the distance to the pin to be processed. Namely, the classification is made, for example, in a way such that 8 pins shown in an area 102 are regarded as pins belonging to a group 1 (G_1), 16 pins shown in an area 103 are regarded as pins belonging to a group 2 (G_2), and 24 pins shown in an area 104 are regarded as pins belonging to a group 3 (G_3) with respect to a pin to be processed represented as 101 of FIG. 1.

Figure 2:
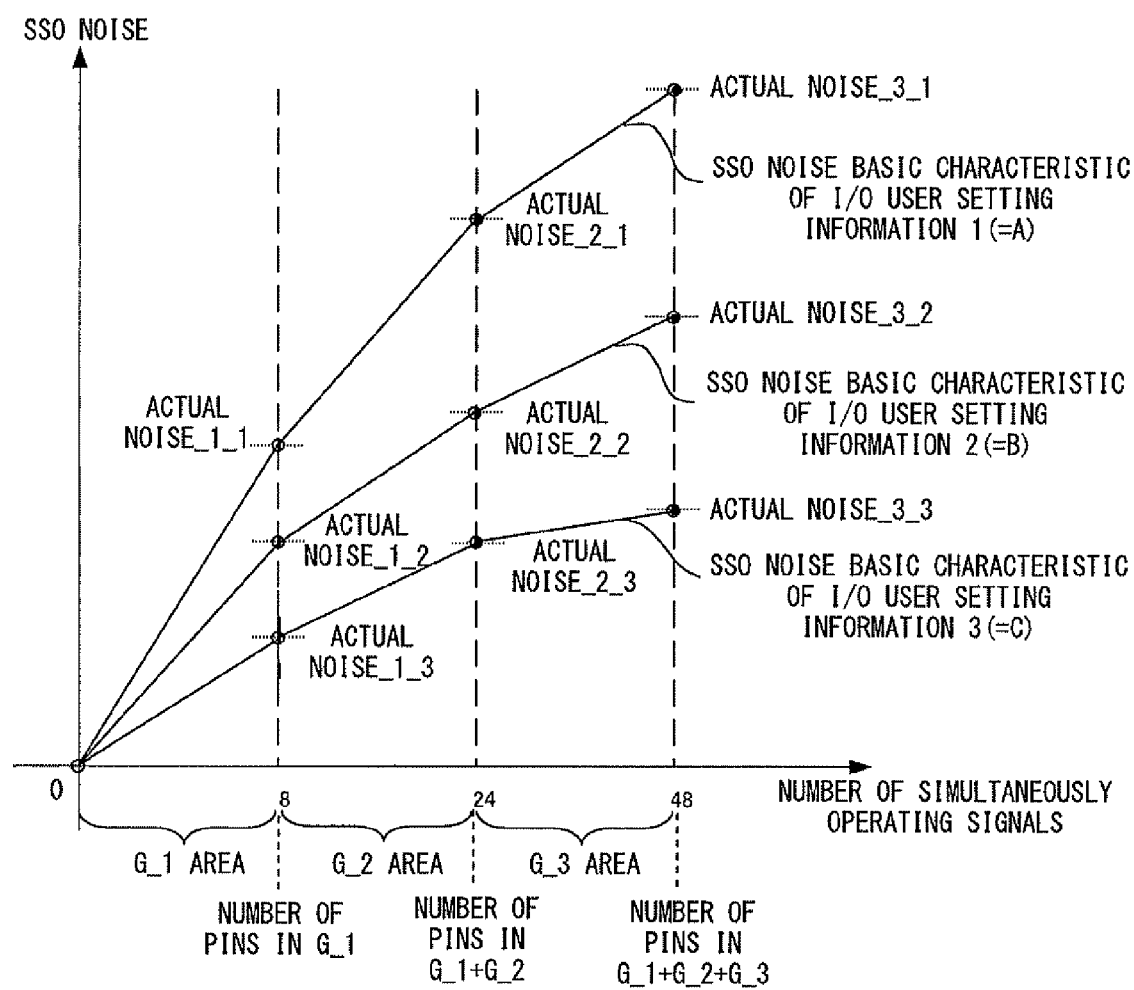
FIG. 2 is a schematic diagram for explaining SSO noise basic characteristics.

If an SSO noise for the pin to be processed is measured with general-purpose circuit analysis simulator software based on such classification, SSO noise basic characteristics represented with plots "●" and their interpolating linear lines in FIG. 2 are obtained.

In this figure, Noise_i_j is assumed to indicate the SSO noise amount of a pin that belongs to a group i (=G_i) and has I/O user setting information j.

Actual Noise_1_1 is an actual simulation value of the SSO noise amount when all the 8 pins belonging to the group 1 (=G_1) have the signal characteristic of I/O user setting information 1 (=A).

Actual Noise_2_1 is an actual simulation value of the SSO noise amount when all the 24 pins in total inside the group 2 (=G_2), namely, the 8 pins belonging to G_1 and the 16 pins belonging to G_2 have the signal characteristic of the I/O user setting information 1 (=A).

Actual Noise_3_1 is an actual simulation value of the SSO noise amount when all the 48 pins in total inside the group 3 (=G_3), namely, the 8 pins belonging to G_1, the 16 pins belonging to G_2, and the 24 pins belonging to G_3 have the signal characteristic of the I/O user setting information 1 (=A).

Similarly, actual Noise_1_2 is an actual simulation value of the SSO noise amount when all the 8 pins belonging to G_1 have the signal characteristic of I/O user setting information 2 (=B), actual Noise_2_2 is an actual simulation value of the SSO noise amount when all the 24 pins in total inside G_2 have the signal characteristic of the I/O user setting information 2 (=B), and actual Noise_3_2 is an actual simulation value of the SSO noise amount when all the 48 pins in total inside G_3 have the signal characteristic of the I/O user setting information 2 (=B).

Similarly, actual Noise_1_3 is an actual simulation value of the SSO noise amount when all the 8 pins belonging to G_1 have the signal characteristic of I/O user setting information 3 (=C), actual Noise_2_3 is an actual simulation value of the SSO noise amount when all the 24 pins in total inside G_2 have the signal characteristic of the I/O user setting information 3 (=C), and actual Noise_3_3 is an actual simulation value of the SSO noise amount when all the 48 pins in total inside G_3 have the signal characteristic of the I/O user setting information 3 (=C).

As is understood from FIGS. 1 and 2, the signal characteristics of the pins differ if I/O user setting information are different. Therefore, the SSO noise amounts differ. Additionally, if the groups differ, a relationship of a distance to a pin to be processed significantly varies. Therefore, the amount of change of the SSO noise amount (=the slope of a basic characteristic) for the number of simultaneously operating signals differs.

However, pins within the same group have almost the same distance relationship (≈coupled inductance value) with a pin to be processed if one piece of I/O user setting information is focused. Therefore, an increase rate of the SSO noise amount when the number of pins having the I/O user setting information increases within the same group can be regarded as being almost constant. In other words, an SSO noise basic characteristic for a piece of I/O user setting information within a group can be approximated with a linear line.

With this characteristic, the SSO noise amount Noise_i_j, which is caused by x_i_j pins when the number of pins that belong to a group G_i and have I/O user setting information j is assumed to be x_i_j, can be simply calculated with linear interpolation from an actual measurement value of the noise amount=actual Noise_i_j in the case where all the pins belonging to G_i have the I/O user setting information j, and from an actual measurement value of the noise amount=actual Noise_i−1_j in the case where there are no pins having the I/O user setting information j in the group G_i and all the pins belonging to groups G_i−1 or smaller have the I/O user setting information j.

If the SSO noise basic characteristic cannot be approximated with a linear line, a value obtained by multiplying x_i_j by a differential coefficient (the slope of a linear line in the case of linear interpolation) of the SSO noise basic characteristic of x_i_j may be calculated as the SSO noise amount Noise_i_j.

Actually, pins having different pieces of I/O user setting information 1 to 3, etc. coexist in the groups G_1, G_2, G_3, etc. as shown in FIG. 3. Therefore, the total SSO noise amount for one pin to be processed is calculated by calculating the total noise amount Noise_i of the SSO noise amounts Noise_1 to Noise_3 within the group for all the pieces of I/O user setting information 1 to 3 for each group i, and by further calculating the total sum of the total amounts Noise_1 to Noise_3 of the SSO noise amounts within the respective groups, which correspond to all the groups G_1 to G_3, as shown in FIG. 4.

The groups can be also classified in a way other than the group classification shown in FIG. 1, for example, by more precisely determining a distance to a pin to be processed. Accordingly, the groups are also represented as G_1, G_1+G_2, G_1+G_2+G_3 in FIGS. 2, 4, etc.

Figure 4:
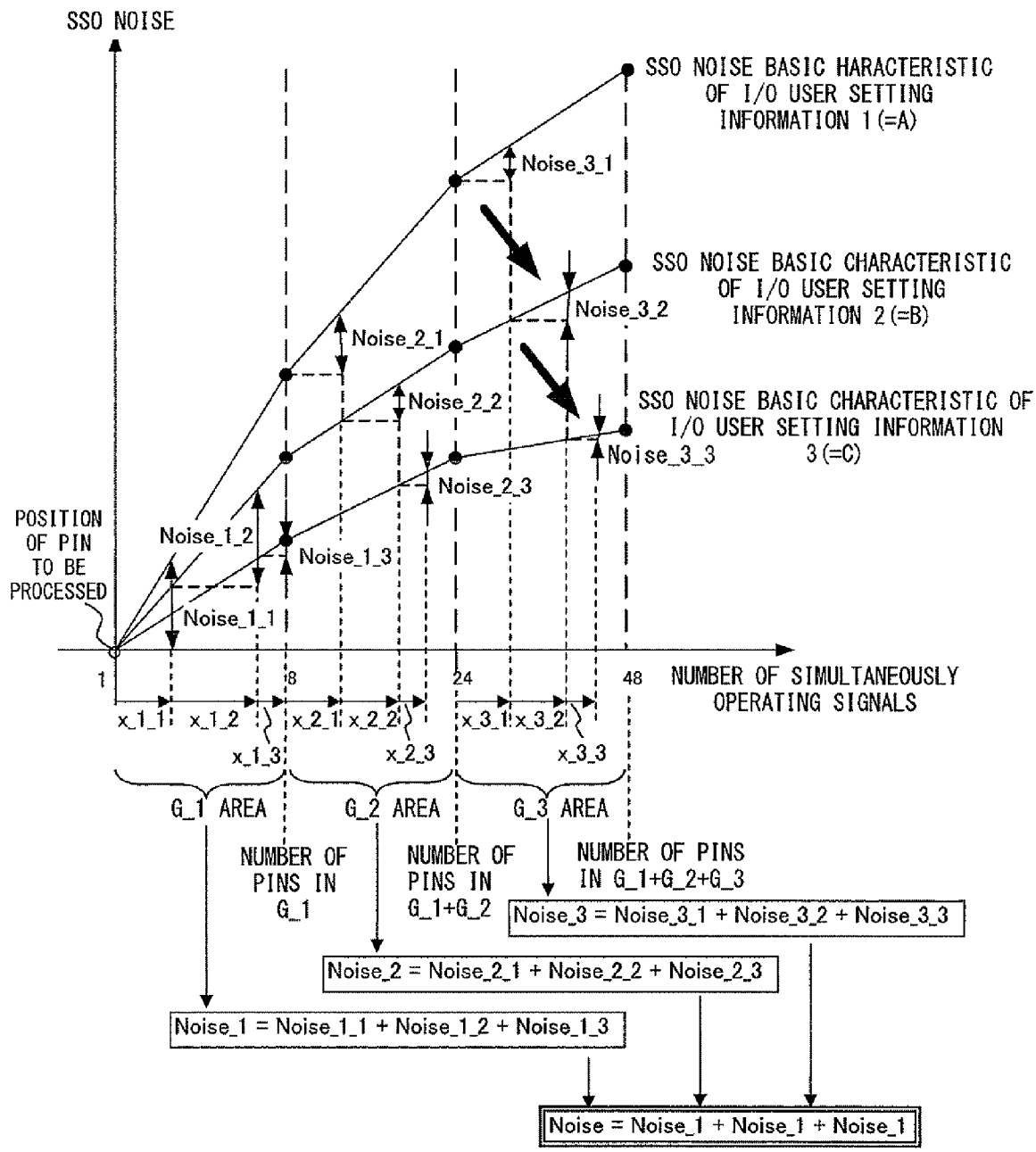
FIG. 4 is a schematic diagram for explaining the principle of an operation for calculating an SSO noise amount.

Here, the SSO noise basic characteristic data shown in FIG. 2 or 4 is assumed to be obtained by actually measuring an SSO noise amount with the use of a standard evaluation board. However, the SSO noise basic characteristic varies depending on a PCB (Printed Circuit Board) mounting an FPGA. Accordingly, not only the characteristic of the FPGA but also an analysis model that includes a PCB mounting the FPGA must be considered to accurately estimate the SSO noise amount. Since a PCB mounting an FPGA is unique to each design, the PCB cannot be obtained realistically with an actual measurement. Therefore, differences exist between the conditions (the number of layers, the length of a via, a wiring pattern, and the like) of an evaluation board and a PCB of an actual device, and the SSO noise basic characteristic data varies. As a result, an error occurs in a calculated noise amount.

Figure 5:
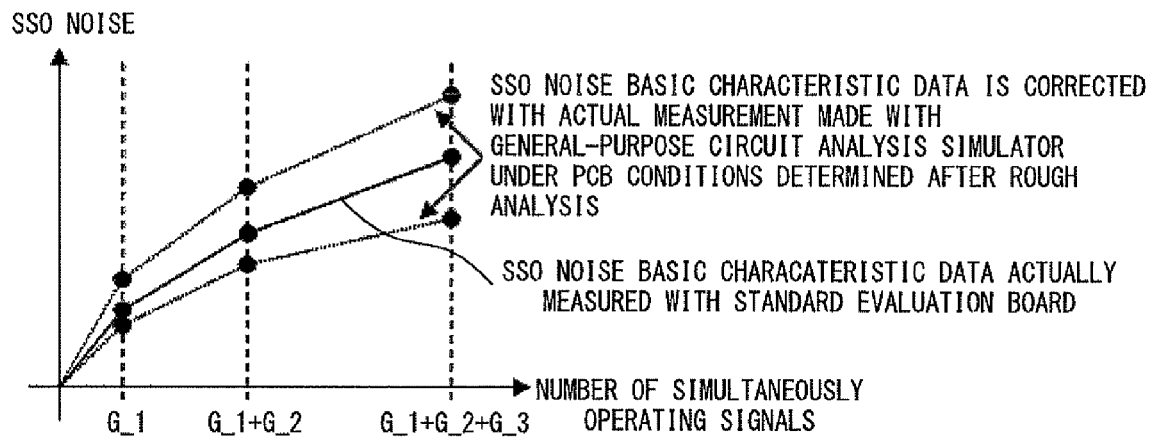
FIG. 5 is a schematic diagram for explaining an operation for correcting SSO noise basic characteristics on the basis of a circuit analysis simulation.

For this reason, in the preferred embodiment according to the present invention, as shown in FIG. 5, a rough analysis is made by using SSO noise basic characteristic data that is actually measured with a conventional standard evaluation board at the initial phase of a design, SSO noise basic characteristic data is obtained with general-purpose circuit analysis simulator software under the conditions of an actual device PCB after the parameters of the PCB are determined in an advanced phase of the design, and an SSO noise amount for a semiconductor pin is analyzed in detail by using the newly obtained SSO noise basic characteristic data.

PLL jitter is considered next.

Figure 6:
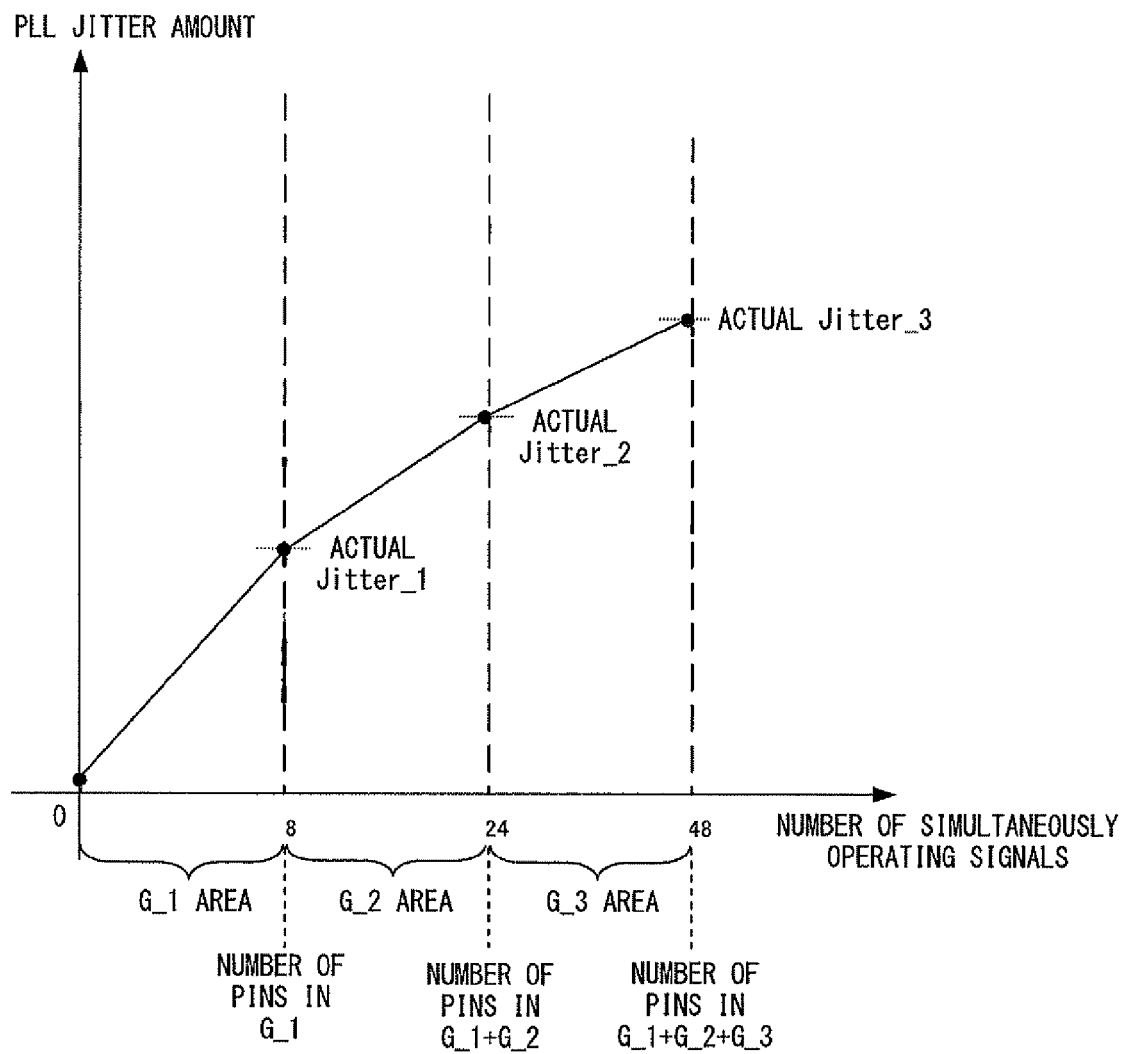
FIG. 6 is a schematic diagram showing a correlation between the number of simultaneously operating signals and a PLL jitter amount.

Initially, in the general-purpose circuit simulator software, pins peripheral to a PLL power supply terminal of an FPGA as a center (this pin is referred to as a "Victim pin") are set to a particular I/O standard (particular I/O user setting information is applied), and a PLL jitter amount is measured while increasing the number of simultaneous output pins=the number of simultaneously operating signals. As a result, a schematic of a correlation between the number of simultaneously operating signals and the PLL jitter amount, which is represented with plots "●" and their interpolating linear lines shown in FIG. 6, is obtained.

In this figure, Jitter_1 is assumed to indicate the PLL jitter amount that is caused by pins belonging to a group i (=G_i) at a Victim pin.

Actual Jitter_1 is an actual simulation value of the PLL jitter amount when the 8 pins belonging to the group 1 (=G_1) have the signal characteristic of the particular I/O user setting information.

Actual Jitter_2 is an actual simulation value of the PLL jitter amount when all the 24 pins in total inside the group 2 (=G_2), namely, the 8 pins belonging to G_1 and the 16 pins belonging to G_2 have the signal characteristic of the particular I/O user setting information.

Actual Jitter_3 is an actual simulation value of the PLL jitter amount when all the 48 pins in total inside the group 3 (=G_3), namely, the 8 pins belonging to G_1, the 16 pins belonging to G_2, and the 24 pins belonging to G_3 have the signal characteristic of the particular I/O user setting information.

The SSO noise basic characteristics for the same I/O user setting information as those used for the measurement of a PLL jitter amount are obtained in the schematic of the correlation between the number of simultaneously operating signals and the PLL jitter amount. Assuming that the I/O user setting information is, for example, the above described I/O user setting information 1 (=A), the SSO noise basic characteristic of the I/O user setting information 1 (=A) shown in FIG. 2 is obtained. Here, a schematic of a correlation between the SSO noise amount and the PLL jitter amount, which is shown in FIG. 7, can be created by referencing FIGS. 2 and 6 for the plotted positions of the number of simultaneously operating signals=1, 8, 24, and 48. This correlation schematic is characterized in having the same correlation characteristic even after a measurement error is permitted, whichever piece of I/O user setting information is selected.

With this characteristic, the SSO noise amount is estimated by regarding a Victim pin arranged at an arbitrary pin position as a pin to be processed, and correlation characteristic data between the SSO noise amount and the PLL jitter amount, which is similar to that shown in FIG. 7 and created beforehand, is referenced, whereby the PLL jitter amount at the Victim pin can be estimated.

Wiring of a PLL power supply within a package, and that of a signal within a package are different. Therefore, the SSO noise amount estimated for the Victim pin is not the absolute value of the SSO noise amount that actually occurs at that pin but an indication amount calculated for the sake of convenience to calculate the PLL jitter amount at that pin. However, the PLL jitter amount calculated from the SSO noise amount accurately corresponds to an actually occurring PLL jitter amount at that pin.

Here, in an actual design, a virtual bank is configured by centering around a PLL power supply terminal VCCpll represented as 801 of FIG. 8, and the SSO noise amount is estimated by regarding the PLL power supply terminal VCCpll as the Victim pin. Then, the PLL jitter amount at the PLL power supply terminal VCcpll is estimated by referencing the correlation characteristic data between the SSO noise amount and the PLL jitter amount.

<Configuration of the Preferred Embodiment According to the Present Invention>

The configuration of the preferred embodiment according to the present invention based on the above described basic principle is described below.

In the preferred embodiment according to the present invention, the arrangement of pins of an FPGA configuring an LSI (Large-Scale Integrated) circuit can be determined by estimating the SSO noise amount and the PLL jitter amount while linking with a design of a PCB mounting the LSI.

Figure 9:
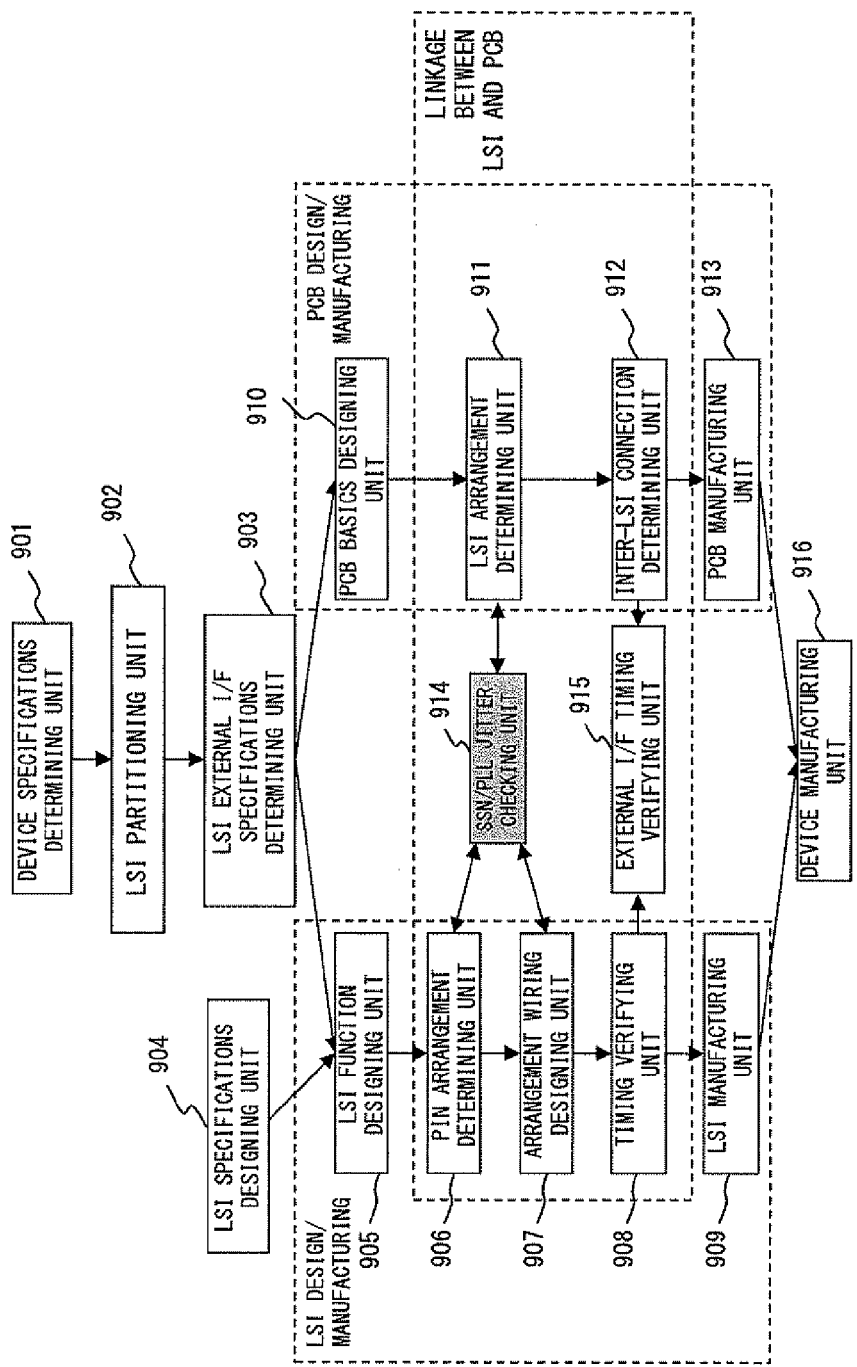
FIG. 9 is a block diagram showing the whole of a preferred embodiment according to the present invention having functions to design and manufacture a device composed of an LSI configured with an FPGA, and a PCB mounting the FPGA.

FIG. 9 is a block diagram showing the whole of the preferred embodiment according to the present invention having functions to design and manufacture a device composed of an LSI (FPGA), and a PCB mounting the LSI.

Initially, a device specifications determining unit 901 determines the entire specifications of a device (product) composed of an FPGA configuring an LSI and a PCB mounting the LSI.

Next, an LSI partitioning unit 902 determines a required LSI function based on the above determined specifications, and makes mapping to mount the LSI on either the side of the FPGA or the side of the PCB.

Thereafter, an LSI external interface (I/F) specifications determining unit 903 determines the specifications of interfaces between the FPSA and the PCB, and between the PCB and an external connecting device.

Hereinafter, designs of the semiconductor device and the PCB respectively proceed.

Functional units denoted with 904 to 909 are functional blocks to design an LSI with an FPGA.

Initially, an LSI specifications designing unit 904 designs the basic specifications of an LSI configured with an FPGA.

Next, an LSI function designing unit 905 designs a function of the LSI on which the design results of the functional units 901 and 902 are reflected.

Thereafter, a pin arrangement determining unit 906 determines the arrangement of pins of the FPGA configuring the LSI, an arrangement wiring designing unit 907 designs wiring in the determined arrangement of pins, and a timing checking unit 908 checks the timing when the LSI properly operates in the pin arrangement and the wiring.

Then, an LSI manufacturing unit 909 manufactures the LSI with the FPGA if the result of the above timing checking is "OK".

In contrast, functional units denoted with 910 to 913 are functional blocks to design a PCB.

Initially, a PCB basics designing unit 910 designs the basics such as the size, the type, etc. of a PCB by reflecting the design results of the functional units 901 and 902.

Next, an LSI arrangement determining unit 911 determines the arrangement of LSIs (the arrangement of a connector and a power supply circuit) to be mounted on the PCB.

Then, an inter-LSI connection determining unit 912 determines connections between LSIs in the determined arrangement of LSIs.

If the arrangement of LSIs and the connections between the LSIs are verified to be suitable as a result of checking the SSO noise amount and the PLL jitter amount by an SSN/PLL jitter checking unit 914 to be described later, and of checking the external interface timing by an external interface (I/F) timing verifying unit 915 to be described later, a PCB manufacturing unit 913 manufactures the PCB.

Upon completion of manufacturing the LSIs by the LSI manufacturing unit 909, and the PCB by the PCB manufacturing unit 913, a device manufacturing unit 916 assembles a final product device from an LSI group and a PCB group.

Here, the SSO noise amount and the PLL jitter amount in the product device can possibly vary depending on wiring based on the arrangement of pins of an FPGA configuring an LSI, and the arrangement of LSIs on the PCB. Accordingly, as a portion particularly related to the present invention, the SSN/PLL jitter checking unit 914 executes a process for estimating an SSO noise for all of pins of an FPGA configuring each LSI to verify whether or not the SSO noise amount is within a permissible range, when the arrangement of pins of an LSI and the design of wiring based on the arrangement of pins are made by the pin arrangement determining unit 906 and the arrangement wiring designing unit 907. The SSN/PLL jitter checking unit 914 also estimates an approximate PLL jitter amount.

If a pin at which an SSO noise amount that does not fall within the permissible range is proved to exist as a result of the SSN checking, the arrangement of pins of an LSI and the design of the wiring based on the arrangement are again made by the pin arrangement determining unit 906 and the arrangement wiring designing unit 907, or the arrangement of LSIs, the arrangement of a power supply circuit, or the number of LSIs or power supply circuits on the PCB are again designed by the LSI arrangement determining unit 911. Moreover, an approximate PLL jitter amount is roughly estimated by the above described jitter checking, and permissible PLL jitter and the timings of LSI/PCB are set based on the estimated approximate amount.

FIG. 10 is a block diagram showing the configuration of the SSN/PLL jitter checking unit 914 shown in FIG. 9 as the preferred embodiment according to the present invention.

As described above in the "basic principle of the preferred embodiment according to the present invention", a rough analysis is made by using SSO noise basic characteristic data that is actually measured with a conventional standard evaluation board in the initial phase of a device design, SSO noise basic characteristic data is again obtained with the general-purpose circuit analysis simulator software under the conditions of an actual device PCB after the parameters of the PCB are determined in an advanced phase of the design, and the SSO noise amount for a semiconductor pin is analyzed in detail by using the newly obtained SSO noise basic characteristic data.

Initially, an evaluation board circuit analysis controlling unit 1001 causes an SSO noise basic characteristic data storing unit 1004 to store the SSO noise basic characteristic data that is actually measured with the conventional standard evaluation board.

Then, an SSO noise calculating unit 1002 executes a process for calculating the SSO noise amount on the basis of information about the arrangement of each pin and I/O user setting information, which are stored in the pin information storing unit 1005, and the SSO noise basic characteristic data obtained based on the evaluation board, which is stored in the SSO noise basic characteristic data storing unit 104. These operations are performed in accordance with the above described "basic principle of the preferred embodiment according to the present invention" although they will be described in detail later.

If the SSN checking result of the SSO noise calculating unit 1002 is "OK", a PLL jitter calculating unit 1007 calculates the PLL jitter amount by using as an input the SSO noise amount for a power supply voltage pin, and by referencing correlation characteristic data (see FIG. 7) between the SSO noise amount and the PLL jitter amount, which is prestored within the PLL jitter calculating unit 1007 itself.

If the SSN checking result of the SSO noise calculating unit 1002 and the jitter checking result of the PLL jitter calculating unit 1007 result in "OK", the actual device design of the PCB is once settled after the above described operations performed by the LSI arrangement determining unit 911 and the inter-LSI connection determining unit 912, which are shown in FIG. 9.

Then, an actual device PCB circuit analysis controlling unit 1003 shown in FIG. 10 obtains the SSO noise basic characteristic data corresponding to the actual device PCB by causing the general-purpose circuit analysis simulator software not particularly shown to run based on the information about the above determined actual device PCB design, and corrects the SSO noise basic characteristic data stored in the SSO noise basic characteristic data storing unit 1004.

Thereafter, the SSO noise calculating unit 1002 again executes the process for calculating the SSO noise amount based on the information about the arrangement of each pin and the I/O user setting information, which are stored in the pin information storing unit 1005, and the SSO noise basic characteristic data that is corrected based on the actual device PCB and stored in the SSO noise basic characteristic data storing unit 1004.

If the second SSN checking result of the SSO noise calculating unit 1002 is "OK", the PLL jitter calculating unit 1007 again calculates the PLL jitter amount by using as an input the SSO noise amount for the PLL power supply voltage pin that is accurately calculated by the SSO noise calculating unit 1002, and by referencing the correlation characteristic data between the SSO noise amount and the PLL jitter amount.

Based on the SSN checking final results 1006 obtained by the detailed operations of the SSO noise calculating unit 1002, and the jitter checking final results 1008 obtained by the detailed operations of the PLL jitter calculating unit 1007, the arrangement of pins of the LSI and the wiring design based on the arrangement, which are made by the pin arrangement determining unit 906 and the arrangement wiring designing unit 907 of FIG. 9, and the arrangement of LSIs on the PCB, which is made by the LSI arrangement determining unit 911, are settled.

As described above, in the preferred embodiment according to the present invention, the SSO noise amount is estimated based on SSO noise basic characteristic data closer to an actual design. Therefore, a device composed of an LSI having a pin arrangement determined based on the estimated amount, and a PCB mounting the LSI can be surely prevented from improperly operating due to an SSO noise.

Additionally, the PLL jitter amount can be estimated from the SSO noise amount that is calculated for the PLL power supply voltage pin, whereby a stricter timing design can be made.

<Operations of the Preferred Embodiment According to the Present Invention>

Operations of the preferred embodiment according to the present invention having the above described configuration are described below.

FIG. 11 is a schematic diagram showing an example of a data structure of the pin information storing unit 1005 shown in FIG. 10.

Information about identifiers for identifying an LSI and a pin, information indicating the row and the column positions of the pin on the LSI, and I/O user setting information applied to the pin are stored for each pin of each LSI configured with an FPGA.

With these items of information, the group classification shown in FIG. 1, and which piece of I/O user setting information a pin within a group possesses can be identified for each pin to be processed on each LSI as described in the "basic principle of the preferred embodiment according to the present invention".

FIG. 12 is a schematic diagram showing an example of a data structure of the SSO noise basic characteristic data storing unit 1004 shown in FIG. 10.

The number of simultaneously operating signals (any of 0, 8, 24 and 48), and their corresponding SSO noise amounts (the unit is millivolt=mV) are stored for each piece of I/O user setting information. These items of information respectively correspond to the numbers of simultaneously operating signals on the horizontal axes shown in FIGS. 2 and 4, and the SSO noise amounts such as the actual Noise_1_1, the actual Noise_2_1, . . . . A relationship with FIG. 2 is represented in a "suffix (reference)" column in FIG. 12.

In FIG. 12, the SSO noise amounts of each pin for which each piece of I/O user setting information is set respectively in the case where the pin operates as a pin on the side of a ground (GND side), and in the case where the pin operates as a pin on the side of a power supply (VCC side) are stored.

Additionally, in FIGS. 2 and 4, the SSO noise amount is 0 when the number of simultaneously operating signals is 0, namely, when a pin to be processed operates alone. Actually, however, there is a slight noise. Therefore, also the SSO noise amounts when the number of SSOs is 1 are stored in FIG. 12.

With the function table data that is shown in FIG. 12 and stored in the SSO noise basic characteristic data storing unit 1004 shown in FIG. 10, the SSO noise basic characteristics shown in FIGS. 2 and 4 are represented.

The above described correlation characteristic data (see FIG. 7) between the SSO noise amount and the PLL jitter amount is fixedly obtained beforehand without depending on I/O user setting information. Therefore, the data may be held as fixed conversion data (such as associative array data) within the PLL jitter calculating unit 1007 shown in FIG. 10.

Figure 13:
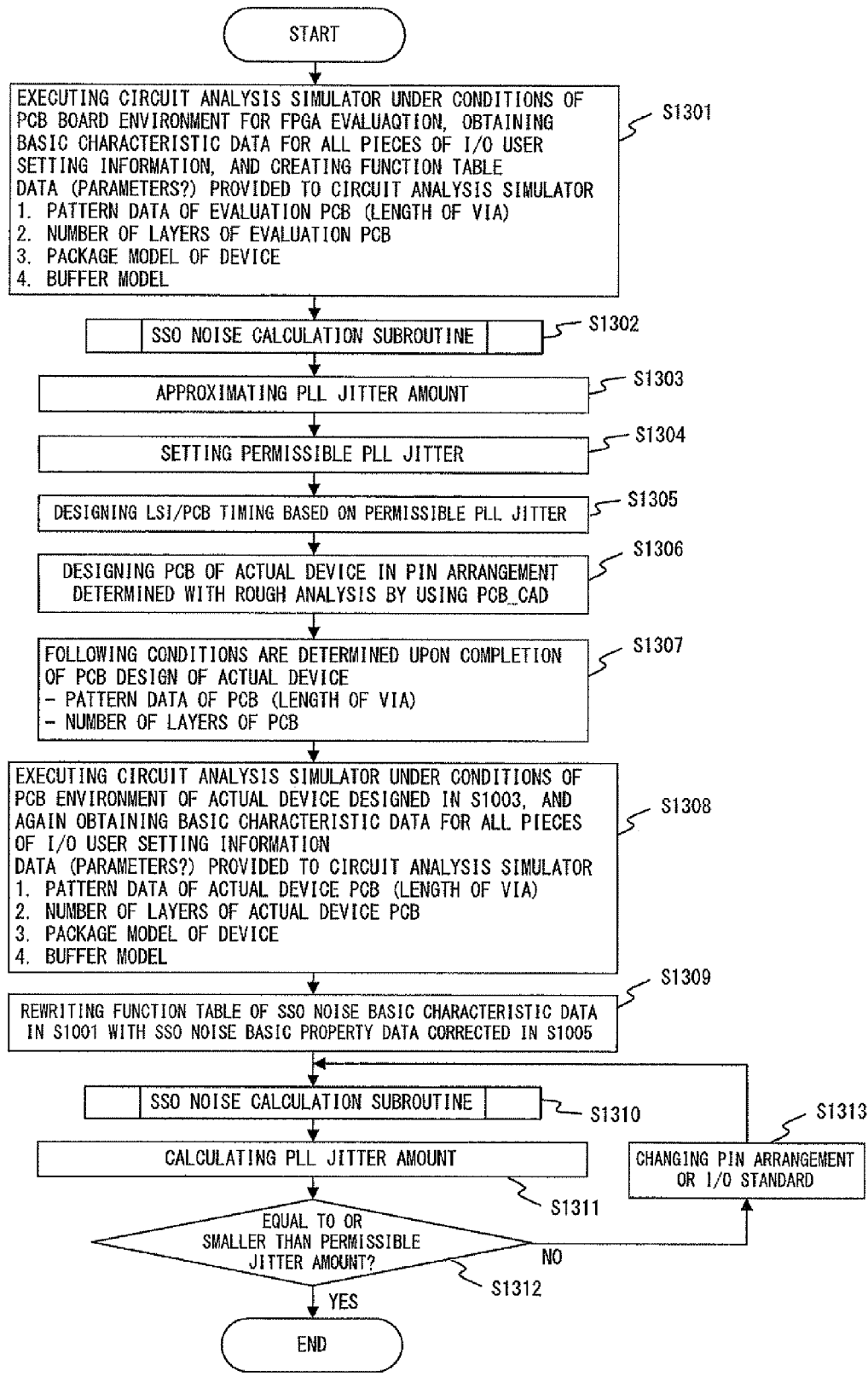
FIG. 13 is a flowchart showing the whole of operations of an SSO noise calculation process.

FIG. 13 is a flowchart showing the operations of the SSN/PLL jitter checking unit 914 that is shown in FIG. 9 and has the functions shown in FIG. 10.

Initially, step S1301 of FIG. 13 is executed by the evaluation board circuit analysis controlling unit 1001 shown in FIG. 10. In this step, the general-purpose circuit analysis simulator software is executed under the conditions of a PCB environment for an FPGA evaluation, SSO noise basic characteristic data is obtained for all of pieces of I/O user setting information, and their function table data is created. SPICE (Simulation Program with Integrated Circuit Emphasis) software developed by the integrated circuit group of the Electronics Research Laboratory, and the EECS department of the University of California, Berkeley, or HSPICE (manufactured by Synopsis, Inc.) derived from SPICE software is available as the general-purpose circuit analysis simulator software. The following parameters are used as parameters provided to the circuit analysis simulator at this time.

1. pattern data of an evaluation PCB (especially, the length of a via)
2. a power supply and a GND model of the evaluation PCB
3. a package model of a device
4. a buffer model of the device As a result of the above described operations, the values of the SSO noise amounts shown in FIG. 12 are obtained, and stored in the SSO noise basic characteristic data storing unit 1004 shown in FIG. 10 in the form of function table data shown in FIG. 12.

Figure 14:
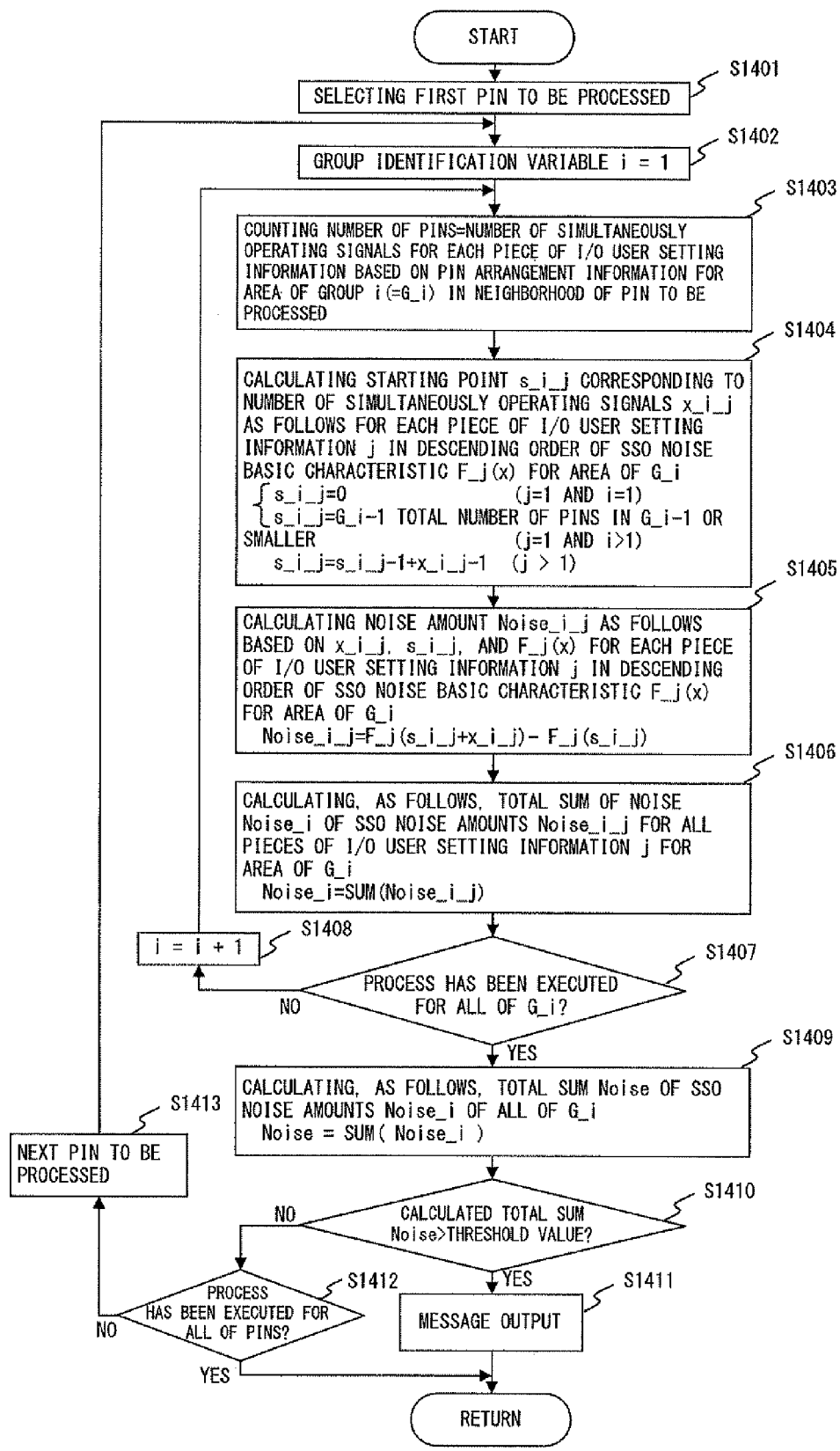
FIG. 14 is a flowchart showing the operations of an SSO noise calculation subroutine.

Next, an SSO noise calculation subroutine in step S1302 of FIG. 13 is further represented in detail by an operational flowchart shown in FIG. 14, and executed by the SSO noise calculating unit 1002 shown in FIG. 10.

In the operational flowchart shown in FIG. 14, the first pin of an LSI, which is stored in the pin information storing unit 1005, is initially selected as a pin to be processed (step S1401).

Next, the value of a variable i indicating a group number is set to 1 (step S1402).

Then, the number of pins, byway of example, for each piece of I/O user setting information A, B, and C is counted as the number of simultaneously operating signals for the 8 pins belonging to the area of the group i (=G_i)=the group 1 (=G_1) (102 of FIG. 1) in the neighborhood of the pin to be processed while the row and the column positions of each pin of the LSI to be processed, and the I/O user setting information, which are stored in the pin information storing unit 1005, are being determined (step S1403) (see FIG. 3).

By way of example, for the area of G_1, the numbers of pins of the I/O user setting information A, B, and C are calculated to be 2, 4, and 2 respectively (see the area of G_1 shown in FIG. 3).

Next, the starting position s_i_j corresponding to the number of simultaneously operating signals x_i_j is determined with the following equations (1) for each piece of I/O user setting information j in the descending order of SSO noise basic characteristic F_j(x) for the area of G_i=G_1 (group 1) (step S1404).

$$s\_i\_j = 0 \; (j=1 \text{ and } i=1)$$

$$s\_i\_j = \text{the total number of pins } (=8, 24, \text{ or } 48) \text{ of } G\_i \text{ or smaller } (j=1 \text{ and } i>1)$$

$$s\_i\_j = s\_i\_j-1 + x\_i\_j-1 \; (j>1) \quad (1)$$

Here, i=1, and the SSO noise basic characteristics for the respective pieces of I/O user setting information are as follows in the examples shown in FIGS. 2 to 4 and 12.

I/O user setting information A>I/O user setting information B>I/O user setting information C Therefore, the following calculations are made.

I/O user setting information 1=I/O user setting information A, x_1_1=2

I/O user setting information 2=I/O user setting information B, x_1_2=4

I/O user setting information 3=I/O user setting information C, x_1_3=2

As a result, the starting position is calculated as follows with the equations (1).

$$s\_1\_1 = 0$$

$$s\_1\_2 = s\_1\_1 + x\_1\_1 = 0+2 = 2$$

$$s\_1\_3 = s\_1\_2 + x\_1\_2 = s\_1\_1 + x\_1\_1 + x\_1\_2 = 0+2+4 = 6$$

Next, the noise amount Noise_i_j is calculated with the following equation (2) based on x_i_j, s_i_j, and F_j(x) for each piece of I/O user setting information j in the descending order of the SSO noise basic characteristic F_j(x) for the area of G_i=G_1 (group 1) (step S1405).

$$\text{Noise}\_i\_j = F\_j(s\_i\_j + x\_i\_j) - F\_j(s\_i\_j) \quad (2)$$

Here, in the examples shown in FIGS. 2 to 4 and 12,
I/O user setting information 1: x_1_1=2, s_1_1=0
I/O user setting information 2: x_1_2=4, s_1_2=2
I/O user setting information 3: x_1_3=2, s_1_3=6

Additionally, the SSO noise basic characteristic F_j(x), namely, F_1(x), F_2(x), and F_3(x) can be calculated as linear functions obtained by linearly interpolating the SSO noise amount in the case of the number of simultaneously operating signals (the number of SSOs)=1, and the SSO noise amount in the case of the number of SSOs=8 (on the GND side) in the function table shown in FIG. 12 for each of the I/O user setting information 1 (=A), 2 (=B), and 3 (=C) in the area of G_i=G_1 as is known from FIG. 2 or 4, and calculated as follows.

$$F\_1(x) = \{(380-50)/(8-0)\}x + \{(8*50-1*380)/(8-0)\} = 41.25*x + 2.5$$

$$F\_2(xf) = \{(305-40)/(8-0)\}x + \{(8*40-1*305)/(8-0)\} = 33.125*x + 1.875$$

$$F\_3(x) = \{(214-30)/(8-0)\}x + \{(8*30-1*214)/(8-0)\} = 23*x + 3.25$$

As a result, the SSO noise amounts Noise_1_1, Noise_1_2, and Noise_1_3 respectively for the I/O user setting information 1 (=A), 2 (=B), and 3 (=C) in the area of G_i=G_1 are calculated with the equation (2) as follows.

$$\text{Noise}\_1\_1 = F\_1(s\_1\_1 + x\_1\_1) - F\_1(s\_1\_1) = \{(41.25*(0+2)+2.5\} - (41.25*0+2.5) = 41.25*2 = 82.5 \text{ (mV)}$$

$$\text{Noise}\_1\_2 = F\_2(s\_1\_2 + x\_1\_2) - F\_2(s\_1\_2) = \{33.125*(2+4)+1.875\} - (33.125*2+1.875) = 33.125*4 = 132.5 \text{ (mV)}$$

$$\text{Noise}\_1\_3 = F\_3(s\_1\_3 + x\_1\_3) - F\_3(s\_1\_3) = \{23*(6+2)+3.25\} - (23*6+3.25) = 23*2 = 46 \text{ (mV)}$$

As is known from the above described equation (2) and FIG. 4, the SSO noise amount Noise_i_j for each piece of I/O user setting information j within the area of G_i is equal to the increment of the SSO noise basic characteristic F_j(x) relative to the increment of the number of simultaneously operating signals x_i_j within the area of G_i for each piece of I/O user setting information j. Accordingly, the equation (2) may be simplified as the following equation (3) if the SSO noise basic characteristic F_j(x) is represented with a linear line.

$$\text{Noise}\_i\_j = a\_j * x\_i\_j \quad (3)$$

where a_j is the slope of the linear line of the SSO noise basic characteristic within the area of G_i. If the basic SSO noise characteristic $F\_j(x)$ is not represented with a linear line, it is desirable to calculate the equation (2) precisely.

If the SSO noise amount Noise_i_j for each piece of I/O user setting information j within the area of $G\_i=G\_1$, namely, Noise_1_1, Noise_1_2, and Noise_1_3 can be calculated in this way, the total SSO noise amount Noise_i=Noise_1 within the area of $G\_i=G\_1$ is calculated as the total sum of the SSO noise amounts (step S1406).

$$\text{Noise\_1}=\text{Noise\_1\_1}+\text{Noise\_1\_2}+\text{Noise\_1\_}\\3=82.5+132.5+46=261\ (\text{mV})$$

When the process for one group area has been executed as described above, whether or not the process has been executed for all of G_i areas is determined (step S1407).

Assuming that $G\_i=G\_1$, and additional areas $G\_2$ and $G\_3$ exist as shown in FIGS. 2 to 4, the determination of step S1407 results in "NO", and the value of the group identification variable i is set to 2 (i=2) by being incremented by 1 (step S1408). Then, the flow goes back to the process of step S1403, and the process for the area of $G\_2$ is repeatedly executed.

For the area of $G\_2$, by way of example, the numbers of pins of I/O user setting information A, B, and C are calculated to be 5, 5, and 5 respectively in step S1403 (see the area of $G\_2$ shown in FIG. 3).

Next, in step S1404, i=2 for the area of $G\_2$, and the SSO noise basic characteristics for the respective pieces of I/O user setting information are as follows in the examples shown in FIGS. 2 to 4 and 12.

I/O user setting information A>I/O user setting information B>I/O user setting information C Therefore, the following calculations are made.

I/O user setting information 1=I/O user setting information A, X_2_1=5

I/O user setting information 2=I/O user setting information B, X_2_2=5

I/O user setting information 3=I/O user setting information C, X_2_3=5

As a result, the starting position is calculated with the equations (1) as follows.

$$s\_2\_1=\text{the number of pins in }G\_1=8$$

$$s\_2\_2=s\_2\_1+x\_2\_1=8+5=13$$

$$s\_2\_3=s\_2\_2+x\_2\_2=s\_2\_1+x\_2\_1+x\_2\_2=8+5+5=18$$

Next, in step S1405, the SSO noise basic characteristic $F\_j(x)$, namely, $F\_1(x)$, $F\_2(x)$, and $F\_3(x)$ can be calculated as linear functions obtained by linearly interpolating the SSO noise amount in the case of the number of simultaneously operating signals (the number of SSOs)=8, and the SSO noise amount in the case of the number of SSOs=24 (on the GND side) in the function table shown in FIG. 12 respectively for the I/O user setting information 1 (=A), 2 (=B), and 3 (=C) in the area of $G\_i=G\_2$ as is known from FIG. 2 or 4, and calculated as follows.

$$F\_1(x)=\{(990-380)/(24-8)\}x+\{(24*380-8*990)/(24-8)\}=38.125*x+0.072$$

$$F\_2(x)=\{(786-305)/(24-8)\}x+\{(24*305-8*786)/(24-8)\}=30.063*x+0.073$$

$$F\_3(x)=\{(524-214)/(24-8)\}x+\{(24*214-8*524)/(24-8)\}=19.375*x+0.077$$

As a result, the SSO noise mounts Noise_2_1, Noise_2_2, and Noise_2_3 for the I/O user setting information 1 (=A), 2 (=B), and 3 (=C) in the area of $G\_i=G\_2$ are calculated with the equation (2) as follows.

$$\text{Noise\_2\_1}=F\_1(s\_2\_1+x\_2\_1)-F\_2(s\_2\_1)=\\38.125*5=190.625\ (\text{mV})$$

$$\text{Noise\_2\_2}=F\_2(s\_2\_2+x\_2\_2)-F\_2(s\_2\_2)=\\30.063*5=150.315\ (\text{mV})$$

$$\text{Noise\_2\_3}=F\_3(s\_2\_3+x\_2\_3)-F\_3(s\_2\_3)=\\19.375*5=96.875\ (\text{mV})$$

When the SSO noise amount Noise_i_j, namely, Noise_2_1, Noise_2_2, and Noise_2_3 for the respective pieces of I/O user setting information j within the area of $G\_i=G\_2$ can be calculated in this way, the total SSO noise amount Noise_i=Noise_2 within the area of $G\_i=G\_2$ is calculated as the total sum of the SSO noise amounts (step S1406).

$$\text{Noise\_2}=\text{Noise\_2\_1}+\text{Noise\_2\_2}+\text{Noise\_2\_}\\3=190.625+150.315+96.875=437.82\ (\text{mV})$$

When the process for the area of $G\_2$ has been executed in this way, the process for the area of $G\_3$ still remains. Therefore, the determination of step S1407 results in "NO", and the group identification variable i is set to 3 (i=3) by being incremented by 1 (step S1408). Then, the flow goes back to the process of step S1403, and the process for the area of $G\_3$ is repeatedly executed.

For the area of $G\_3$, by way of example, the numbers of pins of the I/O user setting information A, B, and C are initially calculated to be 7, 7, and 7 respectively in step S1403 (see the area of $G\_3$ shown in FIG. 3).

Next, in step S1404, i=3 for the area of $G\_3$, and the SSO noise basic characteristics of the respective pieces of I/O user setting information are as follows in the examples shown in FIGS. 2 to 4 and 12.

I/O user setting information A>I/O user setting information B>I/O user setting information C Therefore, the following calculations are made.

I/O user setting information 1=I/O user setting information A, X_3_1=7

I/O user setting information 2=I/O user setting information B, X_3_2=7

I/O user setting information 3=I/O user setting information C, X_3_3=7

As a result, the starting position is calculated with the equations (1) as follows.

$$s\_3\_1=\text{the total number of pins in }G\_2\text{ or smaller}=8+16=24$$

$$s\_3\_2=s\_3\_1+x\_3\_1=24+7=31$$

$$s\_3\_3=s\_3\_2+x\_3\_2=s\_3\_1+x\_3\_1+x\_3\_2=24+7+7=38$$

Next, in step S1405, the SSO noise basic characteristic $F\_j(x)$, namely, $F\_1(x)$, $F\_2(x)$, and $F\_3(x)$ can be calculated as linear functions obtained by linearly interpolating the SSO noise amount in the case of the number of simultaneously operating signals (the number of SSOs)=24, and the SSO noise amount in the case of the number of SSOs=48 (on the GND side) in the function table shown in FIG. 12 respectively for the I/O user setting information 1 (=A), 2 (=B), and 3 (=C) in the area of $G\_i=G\_3$ as is known from FIG. 2 or 4, and calculated as follows.

$$F\_1(x)=\{(1455-990)/(48-24)\}x+\{(48*990-24*1455)/(48-24)\}=19.375*x+0.057$$

$$F\_2(x)=\{(1245-786)/(48-24)\}x+\{(48*786-24*1245)/(48-24)\}=19.125*x+0.053$$

$$F\_3(x)=\{(853-524)/(48-24)\}x+\{(48*524-24*853)/(48-24)\}=13.708*x+0.051$$

As a result, the SSO noise amounts Noise_3_1, Noise_3_2, and Noise_3_3 are calculated with the equation (2) as follows respectively for the I/O user setting information 1 (=A), 2 (=B), and 3 (=C) in the area of G_i=G_3.

$$\text{Noise}\_3\_1 = F\_1(s\_3\_1 + x\_3\_1) - F\_2(s\_3\_1) = 19.375*7 = 135.625 \text{ (mV)}$$

$$\text{Noise}\_2\_2 = F\_2(s\_3\_2 + x\_3\_2) - F\_2(s\_3\_2) = 19.125*7 = 133.875 \text{ (mV)}$$

$$\text{Noise}\_2\_3 = F\_3(s\_3\_3 + x\_3\_3) - F\_3(s\_3\_3) = 13.708*7 = 95.956 \text{ (mV)}$$

When the SSO noise amounts, namely, Noise_3_1, Noise_3_2, and Noise_3_3 for the respective pieces of I/O user setting information j within the area of G_i=G_3 can be calculated in this way, the total SSO noise amount Noise_i=Noise_3 within the area of G_i=C_3 is calculated as the total sum of the SSO noise amounts (step S1406).

$$\text{Noise}\_3 = \text{Noise}\_3\_1 + \text{Noise}\_3\_2 + \text{Noise}\_3\_3 = 135.625 + 133.875 + 95.956 = 365.46 \text{ (mV)}$$

When the process for the area of G_3 has been executed in this way, this means that the process for the areas of all the groups has been executed. Therefore, the determination of step S1407 results in "YES", and the final Noise is calculated by calculating the total sum of the SSO noise amounts Noise_i of all the groups G_i.

$$\text{Noise} = \text{Noise}\_1 + \text{Noise}\_2 + \text{Noise}\_3 = 261 + 437.82 + 365.46 \; 1064.28 \text{ (mV)}$$

When the total sum Noise of the SSO noise amounts for all the groups is calculated as described above, whether or not the total sum is larger than a preset permissible threshold value is determined (step S1410).

If the total sum Noise is larger than the permissible threshold value and the determination of step S1410 results in "YES", a message for prompting a design change is output to a display device, a printing device, which are not shown, a log file, or the like. Here, the SSO noise calculation subroutine of step S1302 shown in FIG. 13 is terminated.

Alternatively, if the total sum Noise is equal to or smaller than the permissible threshold value and the determination of step S1410 results in "NO", whether or not the process has been executed for all of pins on one LSI, each of which is regarded as a pin to be processed, is determined (step S1412).

If the process has not been executed for all the pins, the pin next to the current pin to be processed on one LSI stored in the pin information storing unit 1005 is selected as a new pin to be processed (step S1401).

Thereafter, the process for the SSO noise amount for the pin to be processed is similarly executed, and whether or not the resultant total sum is larger than the permissible threshold value is determined. If the total sum is determined to be larger than the permissible threshold value at least for any one of the pins during this process, the process of step S1411 is executed, and the message for prompting a design change is output.

When the process has been executed for all the pins to be processed and the determination of step S1412 results in "YES", this means that the process of step S1302 shown in FIG. 13 is properly terminated, and the process of the next step S1303 shown in FIG. 13 is executed.

Actually, the above described series of processes are repeatedly executed for all of LSIs stored in the pin information storing unit 1005, and all the LSIs are checked.

Additionally, in the example of the function table shown in FIG. 12, the SSO noise amounts are stored respectively in the case where a pin for which each piece of I/O user setting information is set operates as a pin on the side of the ground (the GND side), and in the case where the pin operates as a pin on the side of the power supply (the VCC side). Therefore, processes similar to the above described ones are repeatedly executed for each piece of I/O user setting information on the sides of the ground and the power supply.

The SSO noise calculation subroutine, which is described above in detail, in step S1302 shown in FIG. 13 is a process for roughly analyzing the SSO noise amount by using the SSO noise basic characteristic data that is obtained with an evaluation PCB and stored by the evaluation board circuit analysis controlling unit 1001 shown in FIG. 10 in the form of the function table data shown in FIG. 12 in the SSO noise basic characteristic data storing unit 1004 shown in FIG. 10.

If this subroutine process is determined to be "OK", processes for PLL jitter in steps S1303 to S1305 shown in FIG. 13 are executed. These processes are executed by the PLL jitter calculating unit 1007 shown in FIG. 10.

Initially, an approximate value of a PLL jitter amount is calculated (step S1303 of FIG. 13). Specifically, the approximate value of the PLL jitter amount is calculated by using as an input the SSO noise amount, which is calculated in step S1302, for a PLL power supply voltage pin at a pin position determined in the design phase at the current time point, and by referencing the correlation characteristic data (see FIG. 7) between the SSO noise amount and the PLL jitter amount, which is prestored in the PLL jitter calculating unit 1007 (FIG. 10).

Next, a PLL jitter amount to be permitted is set as a permissible PLL jitter on the basis of the approximate value of the PLL jitter amount (step S1304 of FIG. 13).

Then, a timing design of an LSI configured with an FPGA, and a PCB mounting the LSI is made on the basis of the permissible PLL jitter (step S1305 of FIG. 13).

Subsequent to the above described processes for PLL jitter, the actual device design of the PCB is once settled after the above described operations are performed by the LSI arrangement determining unit 911 and the inter-LSI connection determining unit 912 (step S1306 of FIG. 13).

The following conditions are determined at this time point (step S1307 of FIG. 13).

pattern data of the PCB (especially, the length of a via)

a power supply and a GND model of the PCB

Then, step S1308 shown in FIG. 13 is executed by the actual device PCB circuit analysis controlling unit 1003 shown in FIG. 10. In this step, the general-purpose circuit analysis simulator software (SPICE, HSPICE, etc.) is executed under the above settled conditions of the actual device PCB environment, SSO noise basic characteristic data is again obtained for all of pieces of I/O user setting information, and their function table data are created. The following parameters are used as parameters to be provided to the circuit analysis simulator at this time.

1. pattern data of the actual device PCB (especially, the length of a via)
2. a power supply and a GND model of the actual device PCB
3. a package model of a device
1. a buffer model of the device As a result of the above operations, correction values of the SSO noise amounts shown in FIG. 12 are obtained, and the contents of the function table data that is shown in FIG. 12 and stored in the SSO noise basic characteristic data storing unit 1004 shown in FIG. 10 are rewritten with these correction values (step S1309).

An SSO noise calculation subroutine in step S1310 of FIG. 13 is again executed by the SSO noise calculating unit 1002 shown in FIG. 10 with the use of the SSO noise basic characteristic data obtained in a state closer to an actual mounting state as described above. These operations are exactly the same as those represented by the above described flowchart shown in FIG. 14. A difference from the above described step S1302 exists in a point that corrected data is used as SSO noise basic characteristic data.

When the SSO noise amount is accurately estimated for all of pins to be processed as described above, and its checking result is determined to be "OK", the processes for the PLL jitter in steps S1311 and S1312 of FIG. 13 are executed. These processes are executed by the PLL jitter calculating unit 1007 shown in FIG. 10.

Initially, the PLL jitter amount is calculated (step S1311 of FIG. 13). The PLL jitter amount calculated here is different from the approximate value of the PLL jitter amount calculated in step S1303, and the SSO noise amount accurately estimated in step S1310 is used. Namely, the PLL jitter amount is accurately calculated by using as an input the SSO noise amount for the PLL power supply voltage pin, which is accurately estimated in step S1310, and by referencing the above described correlation characteristic data between the SSO noise amount and the PLL jitter amount.

Then, whether or not the calculated PLL jitter amount is equal to or smaller than the permissible jitter amount set in step S1304 is determined (step S1312 of FIG. 13).

If the calculated PLL jitter amount is larger than the permissible jitter amount and the determination of step S1312 results in "NO", a pin arrangement or the I/O standard (I/O user setting information) of each pin is changed by the pin arrangement determining unit 906, the arrangement wiring designing unit 907, the LSI arrangement determining unit 911, or the like, which are shown in FIG. 9 (step S1313 of FIG. 13). The flow again goes back to step S1310, and an estimate of the SSO noise amount is restarted.

If the calculated PLL jitter amount is equal to or smaller than the permissible jitter amount and the determination of step S1312 results in "YES", the process executed by the SSN/PLL jitter checking unit 914 shown in FIG. 9 is complete.

SSO noise basic characteristic data is corrected based on an actual design simulation of a PCB after the SSO noise amount and the PLL jitter amount are roughly analyzed, and the SSO noise amount and the PLL jitter amount are analyzed in detail as described above, whereby a simultaneously operating signal noise and PLL jitter can be estimated with high accuracy.

<Configuration in the Case where the Preferred Embodiment According to the Present Invention is Carried out as a Program>

FIG. 15 is a block diagram showing an example of a hardware configuration of a computer that can carry out a device according to the preferred embodiment of the present invention.

The computer shown in FIG. 15 comprises a CPU 1501, a memory 1502, an input device 1503, an output device 1504, an external storage device 1505, a portable recording medium driving device 1506 into which a portable recording medium 1509 is inserted, and a network connecting device 1507, which are interconnected by a bus 1508. The configuration shown in this figure is one example of the computer that can carry out the above described system, and such a computer is not limited to this configuration.

The CPU 1501 controls the whole of the computer. The memory 1502 is a memory such as a RAM, etc. for temporarily storing a program stored in the external storage device 1505 (or the portable recording medium 1509) or data at the time of program execution, a data update, or the like. The CPU 1501 controls the whole of the computer by loading the program into the memory 1502 and by executing the program.

The input device 1503 is configured with, for example, a keyboard, a mouse, etc., and their interface controlling devices. The input device 1503 detects an input operation that a user performs with the keyboard, the mouse, etc., and notifies the CPU 1501 of the detection result.

The output device 1504 is configured with, for example, a display device, a printing device, etc., and their interface controlling devices. The output device 1504 outputs data transmitted under the control of the CPU 1501 to the display device or the printing device.

The external storage device 1505 is, for example, a hard disk storage device, and used to save various types of data and programs.

The portable recording medium driving device 1506 accommodates the portable recording medium 1509 such as an optical disk, an SDRAM, a compact flash etc., and serves as an auxiliary of the external storage device 1505.

The network connecting device 1507 is a device for connecting a communication line of, for example, a LAN (Local Area Network) or a WAN (Wide Area Network).

The system according to this preferred embodiment is carried out in a way such that the CPU 1501 executes a program for carrying out the required functions described in FIGS. 9, 10, etc. The program may be recorded, for example, in the external storage device 1505 or on the portable recording medium 1509 and distributed. Alternatively, the program may be obtained from a network with the network connecting device 1507.

<Complement to the Preferred Embodiment According to the Present Invention>

Simultaneous output operations increase or decrease the delay time of a logic signal, which is called a timing push-out or a timing pull-in, except for jitter in a phase locked loop. Also the timing push-out and timing pull-in can be estimated with a similar manner.

What is claimed is:

1. A jitter amount estimating method for estimating a jitter amount of a semiconductor device by using a computer, the method comprising:
   calculating, by the computer, a first correlation between a number of simultaneous output pins among input/output pins peripheral to a power supply voltage pin as a center and an amount of jitter caused by fluctuations in a power supply voltage;
   calculating, by the computer, a third correlation between an amount of noise caused by the simultaneous output pins and the amount of jitter on the basis of the first correlation and a second correlation between the number of simultaneous output pins among the input/output pins peripheral to the power supply voltage pin as the center and the amount of noise; and
   outputting, by the computer, the jitter amount of the semiconductor device on the basis of the third correlation and the amount of noise.

2. The jitter amount estimating method according to claim 1, wherein:
   the amount of jitter is a jitter amount in a phase locked loop; and the amount of noise is an amount of simultaneously operating signal noise caused by simultaneous operations of the input/output pins for which same user setting information is set.

3. A method for calculating a correlation between a simultaneously operating signal noise amount and a jitter amount, which is intended to estimate a jitter amount of a semiconductor device, by using a computer, the method comprising:

calculating, by the computer, a first correlation between a number of simultaneously operating pins among input/output pins peripheral to a power supply voltage pin as a center and an amount of jitter caused by fluctuations in a power supply voltage, for an input/output pin for which predetermined user setting information is set;

calculating, by the computer, a second correlation between the number of simultaneously operating pins among the input/output pins peripheral to the power supply voltage pin as the center and an amount of simultaneously operating signal noise caused by the simultaneously operating input/output pins, for the input/output pin for which the predetermined user setting information is set; and calculating, by the computer, a third correlation between the amount of simultaneously operating signal noise and the amount of jitter on the basis of the first and the second correlations.

4. The method for calculating a correlation between a simultaneously operating signal noise amount and a jitter amount, which is intended to estimate a jitter amount, according to claim 3, wherein the jitter amount is a jitter amount in a phase locked loop.

5. A jitter amount estimating method for estimating a jitter amount of a semiconductor device by using a computer, the method comprising:

estimating, by the computer, an amount of simultaneously operating signal noise caused by simultaneous operations of input/output pins peripheral to a power supply voltage pin as a center;

estimating, by the computer, an amount of caused jitter by using as an input the estimated amount of simultaneously operating signal noise, and by referencing a correlation between the amount of simultaneously operating signal noise and the jitter amount, which indicates a correlation calculated beforehand between the amount of simultaneously operating signal noise and the jitter amount; and outputting, by the computer, the amount of caused jitter.

6. The jitter amount estimating method according to claim 5, wherein the jitter amount is a jitter amount in a phase locked loop.

7. A method for manufacturing a semiconductor device, and a printed circuit board mounting the semiconductor device by using the jitter amount estimating method according to claim 5, comprising manufacturing a semiconductor device, and a printed circuit board mounting the semiconductor device on the basis of a pin arrangement or signal timing of the semiconductor device, or a layout, a connection between semiconductor devices, or signal timing of the printed circuit board mounting the semiconductor device, where the pin arrangement and the signal timing of the semiconductor device, and the layout, the connection between the semiconductor devices, and the signal timing of the printed circuit board mounting the semiconductor device are designed so that the estimated jitter amount become equal to or smaller than permissible jitter amount.

8. The method for manufacturing a semiconductor device and a printed circuit board mounting the semiconductor device according to claim 7, wherein the jitter amount is a jitter amount in a phase locked loop.

9. A non-transitory recording medium on which is recorded a program for causing a computer, which estimates a jitter amount of a semiconductor device, to execute operations comprising:

a function to calculate a first correlation between a number of simultaneous output pins among input/output pins peripheral to a power supply voltage pin as a center and an amount of jitter caused by fluctuations in a power supply voltage; and a function to calculate a third correlation between an amount of noise caused by the simultaneous output pins and the amount of jitter on the basis of the first correlation and a second correlation between the number of simultaneous output pins among the input/output pins peripheral to the power supply voltage pin as the center and the amount of noise.

10. A non-transitory recording medium on which is recorded a program for causing a computer for calculating a correlation between a simultaneously operating signal noise amount and a jitter amount, which is intended to estimate a jitter amount of a semiconductor device, to execute operations comprising:

a function to calculate a first correlation between a number of simultaneously operating pins among input/output pins peripheral to a power supply voltage pin as a center and an amount of jitter caused by fluctuations in a power supply voltage, for an input/output pin for which predetermined user setting information is set;

a function to calculate a second correlation between the number of simultaneously operating pins among the input/output pins peripheral to the power supply voltage pin as the center and an amount of simultaneously operating signal noise caused by the simultaneously operating input/output pins, for the input/output pin for which the predetermined user setting information is set; and a function to calculate a third correlation between the amount of simultaneously operating signal noise and the amount of jitter on the basis of the first and the second correlations.

11. A non-transitory recording medium on which is recorded a program for causing a computer, which estimates a jitter amount of a semiconductor device, to execute operations comprising:

a function to estimate an amount of simultaneously operating signal noise caused by simultaneous operations of input/output pins peripheral to a power supply voltage pin as a center; and a function to estimate an amount of caused jitter by using as an input the estimated amount of simultaneously operating signal noise, and by referencing a correlation between the amount of simultaneously operating signal noise and the amount of jitter, which indicates a correlation calculated beforehand between the amount of simultaneously operating signal noise and the amount of jitter.

12. A non-transitory recording medium on which is recorded a program for causing a computer, which designs a semiconductor device and a printed circuit board mounting the semiconductor device by using the program according to claim 11, to execute a function to design a pin arrangement or signal timing of a semiconductor device, or a layout, a connection between semiconductor devices, or signal timing of a printed circuit board mounting the semiconductor device, so that the estimated amount of jitter become equal to or smaller than permissible jitter amount.

* * * * *